United States Patent [19]

Remillard

[11] Patent Number: 5,594,435
[45] Date of Patent: Jan. 14, 1997

[54] PERMUTATION-BASED DATA COMPRESSION

[75] Inventor: John F. Remillard, Boulder, Colo.

[73] Assignee: Philosophers' Stone LLC, Cheyenne, Wyo.

[21] Appl. No.: 527,795

[22] Filed: Sep. 13, 1995

[51] Int. Cl.$^6$ ...................................... H03M 7/30
[52] U.S. Cl. .................................................. 341/51
[58] Field of Search ................................. 341/51, 50, 75, 341/90, 106

[56] References Cited

U.S. PATENT DOCUMENTS

| 4,545,032 | 10/1985 | Mak | 341/90 |
| 5,486,826 | 1/1996 | Remillard | 341/51 |

*Primary Examiner*—Brian K. Young
*Attorney, Agent, or Firm*—Townsend and Townsend and Crew LLP; Kenneth R. Allen

[57] ABSTRACT

A lossless compression method and system is provided, wherein an index to a dictionary or table of entries is generated by producing, for a message consisting of a set of finite symbols in a particular order, an assigned order value, where the number of bits to represent the order value plus the number of bits to identify duplicate symbols of the message is smaller than the number of bits contained in the message itself. A complete message can be communicated as an index to a dictionary by communicating a position (inherently communicating the identity) and a count of repetitions of related to that position from which the original position and order can be recovered and the message can be reconstructed. Since the message itself is an index to a dictionary of finite size, any intelligence which can be extracted from an arrangement of symbols found in the dictionary can be reconstructed. Computation of positions can be done recursively. This invention is based on a principle where there is a nontrivial group wherein the number of bits needed to represent the order of a closed set of symbols plus the count of the number of occurrences of each symbol is less than the number of bits needed to represent the symbols.

6 Claims, 2 Drawing Sheets

PERMUTATION-BASED DATA COMPRESSION

BACKGROUND OF THE INVENTION

This invention is related to data compression. More particularly, this invention relates to compression of a class of information in which symbols defining an alphabet are communicated by transmittal of a permutation value identifier.

It can be shown that the amount of accumulated knowledge in the world can be compressed into a binary value of on the order of $2^{120}$. However, the compression task is extremely difficult, time-consuming and generally impractical. Information compression is needed for storage and transmission of information.

Conventional compression schemes combine and discard redundant or lower value information. However, lossless compression is desirable to achieve total reconstruction of expanded information contained in a message or unit of information.

An excellent reference book on known compression techniques is *Data Compression Book* by Nelson. Conventional lossless compression techniques include arithmetic compression, Ziv-Lempel (dictionary-based) compression and Huffman (symbol-entropy-based) compression and run-length encoding. The present invention relates peripherally to dictionary/sorting and run-length encoding compression techniques.

SUMMARY OF THE INVENTION

According to the invention, a lossless compression method and system is provided wherein an entire finite ordered sequence of symbols is manipulated and an index to a dictionary or table of entries is generated by producing an assigned order value. For such a message consisting of a set of finite symbols in a particular order, the assigned order value is selected so that the number of bits to represent the order value plus the number of bits to identify duplicate symbols of the message is smaller than the number of bits contained in the message itself. A complete message can be communicated as an index to a dictionary merely by communicating a position, and thereby inherently communicating the identity of the element in the order, and a count of repetitions related to that position from which the original position and order can be recovered and from which the message can be reconstructed. Since the message itself is an index to a dictionary of finite size, any intelligence which can be extracted from an arrangement of symbols found in the dictionary can be reconstructed.

This invention is based on the principle that a nontrivial group exists wherein the number of bits needed to represent the order of a closed set of symbols plus the count of the number of occurrences of each symbol is less than the number of bits needed to represent the symbols.

Computation of positions can be done recursively. The identity of the order is communicated, so the compressed message communicated by this method can itself be compressed by this method.

This invention will now be explained with reference to specific embodiments, in reference to the accompanying drawings.

DESCRIPTION OF SPECIFIC EMBODIMENTS

Figure 1:
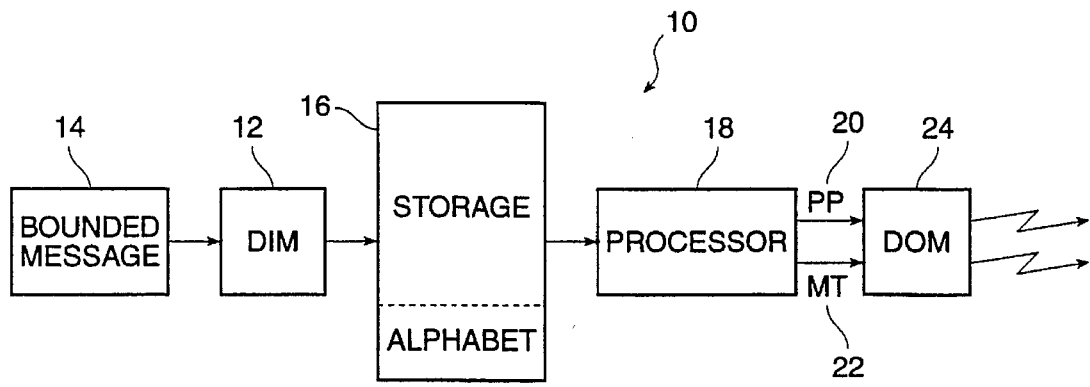
FIG. 1 is a block diagram of a system according to the invention.
Figure 2:
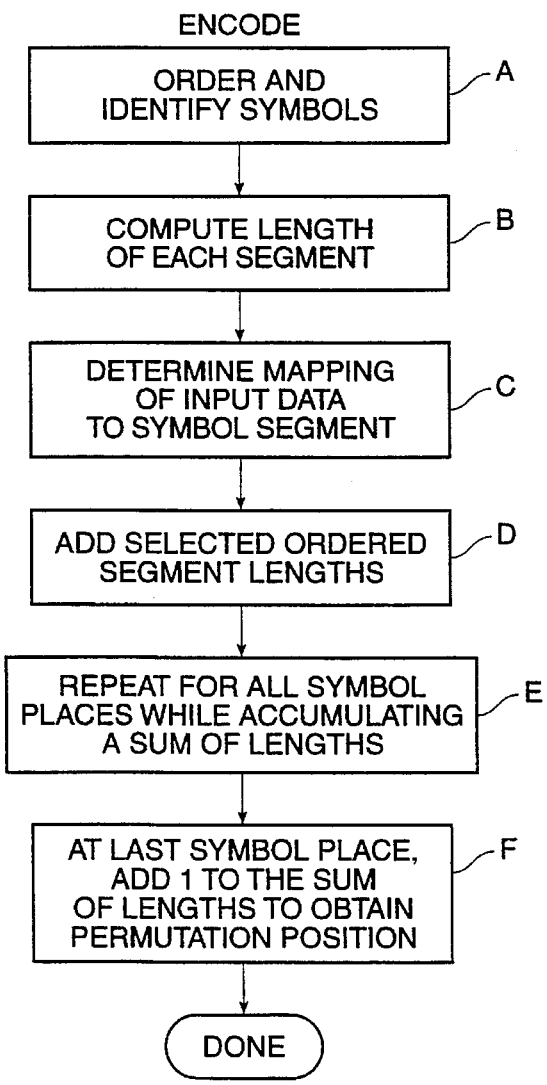
FIG. 2 is a flow chart of an encoding method according to the invention.

FIG. 1 is a block diagram of one embodiment of a data compressor 10 according to the invention. A data input means 12 is for receiving data in the form of a bounded message 14. By bounded message, it is meant a set of data bits representing intelligence which is finite in extent. Many bounded messages could constitute an entire message set. A typical message length is 2048 bits. The bounded message 14 is typically conveyed to a storage means 16. In a general system, the storage means may also contain a selection of alphabets which could be used to describe the bounded message. The alphabets could each consist of a closed set of unique (non-duplicated) symbols of multiple bit length which can be related to a dictionary (not shown). (The dictionary could be used in connection with preprocessing compression. However, this use is beyond the scope of this invention.) A processing means 18 may be used to examine the bounded message and preselect an alphabet appropriate to the message. For example, the alphabet may contain 256 symbols, and the message can be represented completely by use of all 256 symbols.

An ideal message-to-alphabet mapping is an alphabet wherein every symbol is used only once and all parts of the message are completely contained within the symbols of the alphabet. Hence, according to the invention, all that is needed to communicate the bounded message is the permutation position of the bounded message with respect to all possible permutations of said symbols which are found in the bounded message. The permutation order is or can be explicitly defined, or preferably the natural order of the symbols can be employed, i.e., increasing value, or left-to-right from smallest to largest, based on the bit value of the symbol.

For example, an alphabet of eight-bit words has 256 possible symbols. If each symbol occurs once and only once in a message, and if the entire message is represented by 256 symbols, only the permutation number needs to be communicated. There are 256! or $2^{1684}$ permutations of 256 symbols. Since the message would require 2048 (8×256) bits to be transmitted uncompressed, and since only 1684 bits need to be communicated to uniquely identify the permutation position, there is a net compression of 2048−1684=364 bits or 17.8% of lossless compression. As the number of duplicate symbols used in a message increases, the permutation space decreases according to the well-known permutation formula:

$$P = n!/(n-r)!$$

where
P is the number of permutations,
n is the number of symbols,
r is the number of duplicates in use of symbols, and the operator ! on n is the factorial having value $(n)(n-1)(n-2)\ldots(3)(2)(1)$.

In a case where the message contains 260 symbols out of a 256 symbol alphabet and where only 26 symbols of the 256 symbol set is used and each of the 26 symbols of 8 bits each is used exactly ten times, then the number of bits to be communicated is dramatically reduced. The representation of the number of permutation becomes:

$$P=256!/(10!)^{26}$$

(256 factorial divided by 10 factorial to the 26th power) or $2^{1145}$. Thus, only 1145 bits are required to communicate the permutation position of the 2048 bit message of this form. To communicate the number of multiplicities of the symbols, one needs seven bits for the symbol plus four bits for the count times 26 or 11*26=486 bits. Thus, to communicate the entire message in position-and-count form according to the invention is 1145+486=1631 bits, or 22%. It is interesting to note that the number of multiplicities can be used to build table of multiplicities from which can be derived the size of the permutation space and the symbol population of the permutation space. The permutation position 20, and the multiplicity table 20, or so-called symbol count are the compressed output via a data output means 24 to a data receiver and decompressor or decoder. It is to be noted that a four-bit limit sets the upper limit of the number of repetitions of symbols in this example to 16. There is no requirement that the symbols have identical repetition numbers, of course, as this is merely a specific example of the relationship:

$$P=n!/(a!b!c!d!e!f!g!...)$$

where a, b, c, d, e, f, g are positive numbers and represent the number of repetitions of a finite number of different specific symbols.

To understand how to decode, one must understand how to encode. The first step is to order and identify symbols (Step A). Given n symbols, first the number of m distinct (different) symbols is identified and used to partition the symbol space into k segments. Each segment will correspond to a distinct symbol type. There are thus k distinct symbol types. (In a system where the distinct words are binary, i.e., digital bits, then k=2). The first segment will consist of all permutations of symbols whose highest significant bit is smallest. The second segment will consist of all permutations of symbols whose highest significant bit is second smallest, and so on for all bit places and bit values.

Next the length of each segment is computed (Step B). The length of each segment can be viewed as the number of permutations on the original n symbols without the symbol that characterizes that particular segment in the order of segments described above. From this information, one can begin to build a "tree" of segments. Each of the segments stores the particular permutations associated with the leading symbol or the symbol in the most significant place.

From this further information, the system determines the segment to which the particular input data can be mapped (Step C). Then all the lengths of the segments, up to but not including the segment wherein the symbol is found, are added together (Step D). This step generates a sum of all lengths to that point in the process.

The process of steps A through D is then repeated for the next most significant symbol place, and the sum is augmented by the accumulated symbol length value (Step E). The process stops when one symbol has the lowest significant place. The sum is then augmented by the value 1 (Step F).

This sum corresponds to the position number or permutation position of this message in the finite symbol space.

The multiplicity table is calculated prior to this process during a scan of the message wherein the symbols are simply counted.

At the receiving end is a data decoder or data decompressor. The data decompressor may be a straight-forward dictionary of symbol position and multiplicity table which can be used, without anything more, to totally reconstruct the symbols and their original order in the bounded message 14. This follows from simple combinatorics as explained above with respect to the method according to the invention.

Figure 3:
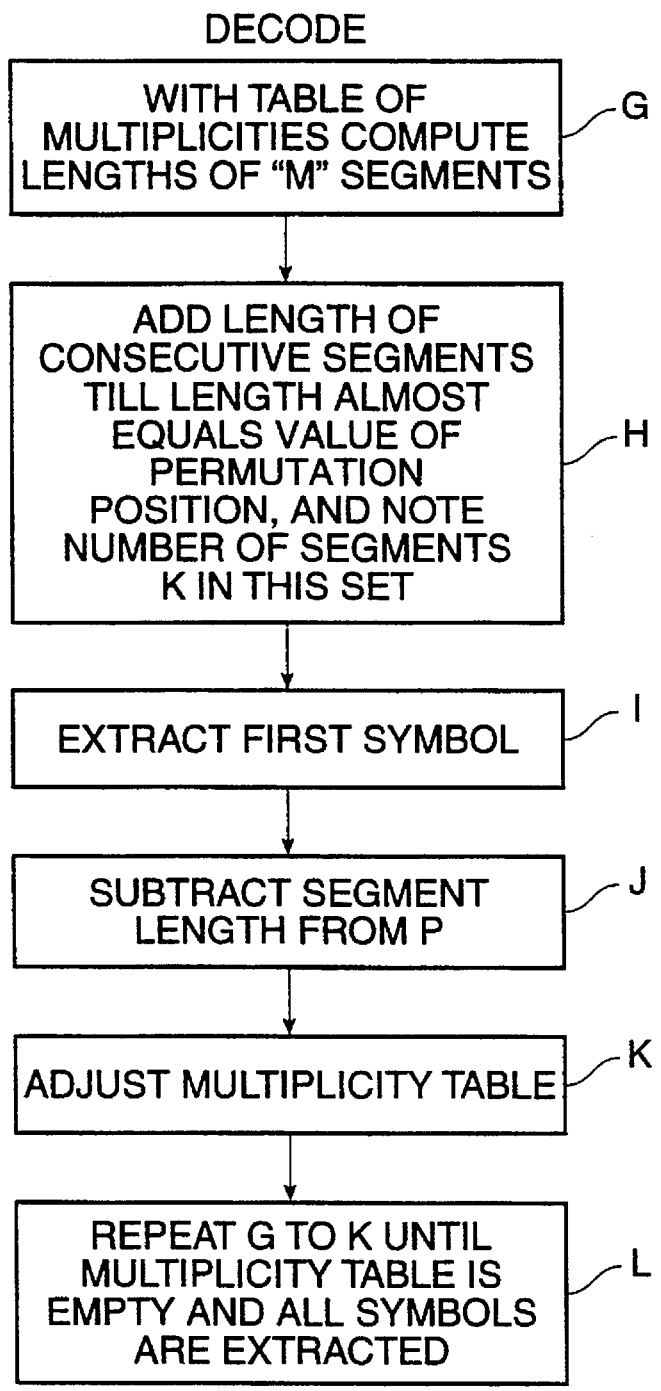
FIG. 3 is a flow chart of a decoding method according to the invention.

According to the decoding method of the invention, as shown in FIG. 3, using arithmetic of arbitrary word size, the table of multiplicities is used to compute the lengths of the "M" segments found in the table (Step G). There will be a segment for each symbol in the alphabet.

Then the system finds the value which is the sum of the longest set of lengths of consecutive segments whose value is less than the value of the permutation position and note is made of the number K of segments required to arrive at that sum (Step H). This summing of consecutive neighboring segment lengths less than the permutation position value tells us that the first symbol of the message will be the next largest from the smallest symbol value (K+1st word), assuming there has been a natural numerical ordering of the words. Thus, the first symbol is extracted (Step I). To arrive at the second symbol, the segment length of the first K segments computed above is subtracted from the permutation position value P (Step J).

Thereafter, the table of multiplicities is adjusted to account for the extracted symbol by for example decrementing the number of the frequency of the symbol which was extracted and by decrementing the value of the number of original symbols (Step K).

These steps (G–K) are repeated until all the symbols are extracted (Step L), thus decoding the message.

The amount of compression which can be achieved is indicated by the following analysis, provided courtesy of mathematician Kadosa Halasi of 1243 Aikins Way, Boulder, Colo. Kadosa Halasi derived the addressing scheme estimate, BITS(A)/n "for large n" (typically n>10), by application of Stirling's formula relying on one of the elements of proof of Stirling's formula, namely, that a sequence of constants converges to $\sqrt{(2\pi)}$ in a monotonically decreasing fashion.

Stirling's formula is used to approximate factorials. According to Stirling's formula, for large n:

$$n! \approx \sqrt{(2\pi)} \ n^{n+1/2}e^{-n} \qquad (1)$$

The Addressing Scheme ("AS") encodes a source or symbol stream U of n symbols. In that symbol stream U, there are k distinct symbol types $S_i$, where i is between 1 and k. The multiplicity is represented by the absolute value of $S_i$ or $|S_i|$.

The Addressing Scheme AS is a process which assigns an address A to the symbol stream U, wherein the maximum value of A (herein $A_\infty$) is given by:

$$A_\infty = (n?)/\Pi_i |S_i| \qquad (2)$$

where i is the index ranging from 1 to k, and

Π is the multiplication operator.

The number of bits required to represent A is the smallest integer not exceeding the base 2 log of A, plus 1, or:

$$BITS(A)=[\log_2(A)]+1 \qquad (3)$$

where [] is a standard operator representing the selection of that smallest integer not exceeding the content of the brackets.

The symbol "BITS(A)" denotes the number of bits in the binary representation of A. It can be shown that, in the course of deriving the value for AS for large numbers, the upper bound of BITS(A) is:

$$BITS(A) \leq (1-k)\log_2(\sqrt{(2\pi)}) + nH(U) + 1/2\log_2(n) + 1 \quad (4)$$

where H(U) is the entropy of source U.

Of importance herein is the average number of bits per symbol in the address A of the source U. Thus:

$$BITS(A)/n \leq (1-k)/n*\log_2(\sqrt{(2\pi)}) + H(U) + \log_2(n)/(2n) + 1/n \quad (5)$$

(A more precise inequality might include the bracket operator of Equation 3 around all but the last term.)

The standard definition of entropy written in terms of the frequencies of the symbols is given by:

$$H(U) \equiv \Sigma_i(|S_i|/n)\log_2(n/|S_i|) \quad (5a)$$

In practical applications, the value n will be large, in which case the final two terms of Equation 5 become insignificant and the Addressing Scheme (AS) estimate becomes the first two terms, or:

$$BITS(A)/n \leq (1-k)/n*\log_2(\sqrt{(2\pi)}) + H(U) \quad (6)$$

Equation 6 shows that the addressing scheme will never exceed the value of the source entropy, since the first term always produces a nonpositive value, which has the impact of decreasing the number of bits per symbol.

Current schemes of compression, under the best of conditions, generate compressed code where the number of bits per symbol equal the source entropy. This can be shown by reference to Shannon's Law, a law of the entropy of information applicable to symbol-by-symbol encoding and decoding of a source U. Shannon's Law for the encoded version of U, herein U' satisfies the relationship:

$$H(U) \leq BITS(U')/n < H(U)+1. \quad (7)$$

The above constraint spelled out by Shannon's Law applies to the symbol-by-symbol encoding algorithms, such as Shannon-Fano coding, Huffman coding and various arithmetic methods. This constraint does not apply in the present invention (except in the non-interesting degenerative case where n=1 and k=1) because there is no symbol-by-symbol encoding.

The estimate on the number of the bit count in A shown in Equation 6 is the upper bound. The lower bound for the address A can be as small as unity. Furthermore, it follows from Equation 6 that the worst case for the value AS produces an address A having $(1-k)/n*\log_2(\sqrt{(2\pi)})$ fewer bits per source symbol S than the best symbol-by-symbol encoding algorithms.

The optimal addressing scheme occurs when k is nearly the size of integer n, in which $|S_i|=1$. In this case, AS requires on the average at least $$(1-n)/n*\log_2(\sqrt{(2\pi)}) \approx 1.3257 \quad (8)$$

fewer bits per symbol to encode U.

In a practical embodiment of a compression scheme according to the invention, the value k, the number of distinct symbols occurring in the symbol stream U is finite and predetermined. (An example is eight-bit words producing 56 symbol types possible.) In order to optimize compression under those circumstances, the value n should not be excessively long in comparison to k. Conversely, if the size of the stream n is fixed, as when the stream is packetized, new symbols k should be formed from the old symbols to assure that the number of symbol types k is of the same "size" as n. If n is much larger than k, the asymptotic value is the entropy H(U).

Since each of the encoding algorithms carries with itself an overhead for example in the table of multiplicities. Where k is equal to 2 in the present invention, the overhead is small, on the order of a couple of bytes. Where k=2, it has been verified that the present invention clearly beats prior compression methods in terms of compression efficiency. Larger values of k, while producing greater overhead, are expected to show even greater improvement over compression schemes relying on symbol-by-symbol compression. If a stream of distinct symbols could be produced where k=n, there would be optimal compression. (By comparison, Huffman codes could not even compress a single information stream of n different symbols, since the entropy would be n, with n bits assigned to each symbol. In practice, Huffman codes recognize only 16 different symbols, according to the Nelson reference.)

The invention has now been explained with respect to specific embodiments. Other embodiments will be apparent to those of ordinary skill in the art. For example, the compressor according to the invention may be constructed in the form of a programmable logic array, such as an Field Programmable Gate Array, wherein the count on the number of symbols is mapped through an read only array thus quickly identifying numbers of occurrences of each symbol and the bounded message is mapped to a unique permutation position. This lookup table would be about 2048 bits by 2048 bits or about 4.2 million bits or 525,000 bytes. Therefore it is not intended that this invention be limited, except as indicated by the appended claims.

What is claimed is:

1. In a data processing system having a data input means, a data output means, processing means and storage means, said processing system for operation on a non-empty closed set of symbols, a method for compressing data comprising the steps of:

receiving a bounded message via said data input means to said storage means, said bounded message consisting of a number of distinct symbol types;

examining said bounded message with said processing means; thereupon selecting with said processing means a symbol set for describing said bounded message, said symbol set consisting of a closed set of unique symbols, each symbol being of multiple bit length, for use in representing said bounded message to a dictionary;

counting with said processing means numbers of occurrences of each said symbol found in said bounded message to obtain symbol counts; thereafter determining with said processing means a unique permutation position of said bounded message with respect to all possible permutations of said symbols found in said bounded message; and communicating said symbol counts with reference to said symbols found in said bounded message and said unique permutation position via said data output means as compressed information for use in the dictionary in order to reconstruct the bounded message.

2. The method according to claim 1 wherein the number of distinct symbol types is two (i.e., k=2) to produce a binary-valued symbol set comprising data bits of values 1 and 0.

3. The method according to claim 1 further including, after said counting step, processing said message such that the number of distinct symbol types is equal to the total number of different symbols used in said message and the distinct symbol types are used once and only once in said message (i.e., k=n).

4. A data processing system, having a data input means and a data output means, for compressing a message built of a non-empty closed set of symbols, said system comprising:

means for receiving a bounded message via said data input means, said bounded message consisting of a number of distinct symbol types describable with an alphabet, said alphabet consisting of a closed set of unique symbols, each symbol being of multiple length, said alphabet for use in representing said bounded message to a dictionary;

means coupled to said receiving means for identifying numbers of occurrences of each said symbol found in said bounded message to obtain symbol counts;

means for mapping said bounded message to a unique permutation position of said bounded message with respect to all possible permutations of said symbols found in said bounded message; and means coupled to said mapping means for communicating said symbol counts with reference to said symbols found in said bounded message and said unique permutation position via said data output means as compressed information for use in the dictionary to reconstruct the bounded message.

5. The system according to claim 4 wherein the number of distinct symbol types is preset to two (i.e., k=2) to produce a binary-valued symbol set comprising data bits of values 1 and 0.

6. The method according to claim 4 further including means coupled to said numbers identifying means for processing said message such that the number of distinct symbol types is equal to the total number of different symbols used in said message and the distinct symbol types are used once and only once in said message (i.e., k=n).

* * * * *